(12) United States Patent
Terada et al.

(10) Patent No.: US 7,345,546 B2
(45) Date of Patent: Mar. 18, 2008

(54) AMPLIFIER CIRCUIT AND INPUT CIRCUIT

(75) Inventors: Akihiro Terada, Atsugi (JP);
Nagayoshi Dobashi, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 126 days.

(21) Appl. No.: 11/066,039

(22) Filed: Feb. 25, 2005

(65) Prior Publication Data

US 2006/0066402 A1    Mar. 30, 2006

(30) Foreign Application Priority Data

Sep. 29, 2004   (JP) .............................. 2004-284856

(51) Int. Cl.
*H03G 3/30* (2006.01)
(52) U.S. Cl. ..................... 330/282; 330/284; 330/86
(58) Field of Classification Search ................ 330/252, 330/254, 259–261, 282–284
See application file for complete search history.

(56) References Cited

U.S. PATENT DOCUMENTS 5,581,213 A * 12/1996 Linder et al. ............... 330/282
6,147,558 A * 11/2000 Sculley ....................... 330/284
7,068,107 B2 * 6/2006 Wang et al. ................. 330/282
7,068,108 B2 * 6/2006 Xu et al. ..................... 330/284

FOREIGN PATENT DOCUMENTS

| EP | 0774834 | 5/1997 |
| JP | 54 114228 | 9/1979 |
| JP | 58 218212 | 12/1983 |

* cited by examiner

*Primary Examiner*—Robert Pascal
*Assistant Examiner*—Hieu Nguyen
(74) *Attorney, Agent, or Firm*—Ladas & Parry LLP

(57) ABSTRACT

A disclosed amplifier circuit is capable of changing a gain to amplify an input signal according to a control signal. The amplifier circuit comprises a differential amplifier circuit adapted to receive and amplify the input signal to output the amplified input signal as an output signal, a first resistance and one or more second resistances connected to the differential amplifier circuit and adapted to set the gain, and one or more gain control circuits adapted to change the gain by controlling one or more electrical couplings of the one or more second resistances according to the control signal.

8 Claims, 5 Drawing Sheets

AMPLIFIER CIRCUIT AND INPUT CIRCUIT

CROSS-REFERENCE TO RELATED APPLICATIONS

The present application claims priority to Japanese patent application number 2004-284856 filed on Sep. 29, 2004, which is incorporated herein by reference in its entirety.

BACKGROUND OF THE INVENTION

1. Field of the Invention

The present invention relates to an amplifier circuit and an input circuit, and particularly relates to an amplifier circuit and an input circuit capable of changing a gain.

2. Description of the Related Art

Apparatuses for processing video signals sometimes receive different levels of video signals depending on the type of devices connected thereto. The apparatuses therefore require input circuits for amplifying the input video signals to the level compatible with the devices and outputting the amplified signals.

FIG. 4 is a circuit diagram of a related-art input circuit 1.

The input circuit 1 comprises first and second amplifier circuits 11 and 12 with voltage gain different from each other, and switching circuits 13 and 14.

An input voltage Vin1 from an input terminal Tin1 is applied to the first and second amplifier circuits 11 and 12. The first amplifier circuit 11 amplifies the input voltage Vin1 applied from the input terminal Tin1 at a voltage gain Gv1. The output of the first amplifier circuit 11 is sent out from an output terminal Tout1 via the switching circuit 13.

The second amplifier circuit 12 amplifies the input voltage Vin1 applied from the input terminal Tin1 at a voltage gain Gv2. The output of the second amplifier circuit 12 is sent out from an output terminal Tout1 via the switching circuit 14.

The switching circuit 13 is switched on/off according to a gain control signal CNTL1. The switching circuit 14 is switched on/off according to a signal /CNTL1, which is an inverted signal of the gain control signal CNTL1. Therefore, the switching circuit 13 is ON when the switching circuit 14 is OFF, and the switching circuit 13 is OFF when the switching circuit 14 is ON.

When the switching circuit 13 is ON and the switching circuit 14 is OFF, the input voltage Vin1 of the input terminal Tin1 is amplified by the first amplifier circuit 11 with the voltage gain Gv1 and then output as an output voltage Vout1 from the output terminal Tout1. When the switching circuit 13 is OFF and the switching circuit 14 is ON, the input voltage Vin1 of the input terminal Tin1 is amplified by the second amplifier circuit 12 with the voltage gain Gv2 and then output as an output voltage Vout2 from the output terminal Tout1.

This input circuit 1 of FIG. 1 is not economical in power consumption, because both of the first and second amplifier circuits 11 and 12 are always driven.

FIG. 5 is a circuit diagram of another related-art input circuit 2. In FIG. 5, elements identical to those in FIG. 4 are denoted by the same reference numbers.

The input circuit 2 shown in FIG. 5 is provided with a switching circuit 21 disposed between the first amplifier circuit 11 and a supply voltage Vcc for providing a drive voltage to the first amplifier circuit 11 in place of the switching circuit 13, and a switching circuit 22 disposed between the second amplifier circuit 12 and a supply voltage Vcc for providing a drive voltage to the second amplifier circuit 12 in place of the switching circuit 14.

The switching circuit 21 is switched on/off according to a gain control signal CNTL2. The switching circuit 22 is switched on/off according to a signal /CNTL2, which is an inverted signal of the gain control signal CNTL2. Therefore, the switching circuit 21 is ON when the switching circuit 22 is OFF, and the switching circuit 21 is OFF when the switching circuit 22 is ON.

When the switching circuit 21 is ON and the switching circuit 22 is OFF, the first amplifier circuit 11 is in an operating state and the second amplifier circuit 12 is in a suspended state. The input voltage Vint1 input from the input terminal Tin1 is amplified by the first amplifier circuit 11 with the voltage gain Gv1, and then output as an output voltage Vout1 from the output terminal Tout1. On the other hand, when the switching circuit 21 is OFF and the switching circuit 22 is ON, the first amplifier circuit 11 is in the suspended state and the second amplifier circuit 12 is in the operating state. The input voltage Vint1 input from the input terminal Tin1 is amplified by the second amplifier circuit 12 with the voltage gain Gv2, and then output as an output voltage Vout2 from the output terminal Tout1.

The input circuit 2 can reduce the power consumption, because it can suspend the operation of either one of the amplifier circuits 11 and 12 by having the switching circuit 21 disposed between the supply voltage Vcc and the first amplifier circuit 11 and the switching circuit 22 disposed between the supply voltage Vcc and the second amplifier circuit 12.

However, this type of amplifier circuit needs to have plural differential amplifier circuits each having a resistance to set a specified gain, and therefore increases the size of the circuit as well as, if applied to IC chips, the chip area.

Also, a complicated control mechanism is required in order to operate one differential amplifier circuit and to stop the rest of the differential amplifier circuits by suspending the power supply thereto.

SUMMARY OF THE INVENTION

A general object of the present invention is to provide an amplifier circuit to overcome at least one disadvantage described above. A specific object of the present invention is to provide a simple amplifier circuit capable of changing a gain.

According to an aspect of the present invention, an amplifier circuit capable of changing a gain to amplify an input signal according to a control signal comprises a differential amplifier circuit adapted to receive and amplify the input signal to output the amplified input signal as an output signal, a first resistance and one or more second resistances connected to the differential amplifier circuit and adapted to set the gain, and one or more gain control circuits adapted to change the gain by controlling one or more electrical couplings of the one or more second resistances according to the control signal.

It is preferable that an end of the second resistance be connected to the differential amplifier circuit, and the gain control circuit be configured to switch the state of the other end of the resistance between an open state and a state where a reference voltage is applied thereto.

It is also preferable that the second resistances be plural resistances connected in series or in parallel, and the one or more gain control circuits be adapted to short-circuit or open an end of each of the plural second resistances.

According to the present invention, by switching on/off the connection of the resistances connected to the differential amplifier circuit according to the control signal, the gain of the amplifier circuit formed by the differential amplifier circuit and the resistances is changed. As such, simply having one differential amplifier circuit allows the gain control. The amplifier circuit can therefore result in a reduced chip area, if applied to an IC.

DETAILED DESCRIPTION OF THE PREFERRED EMBODIMENT

First Embodiment

Figure 1:
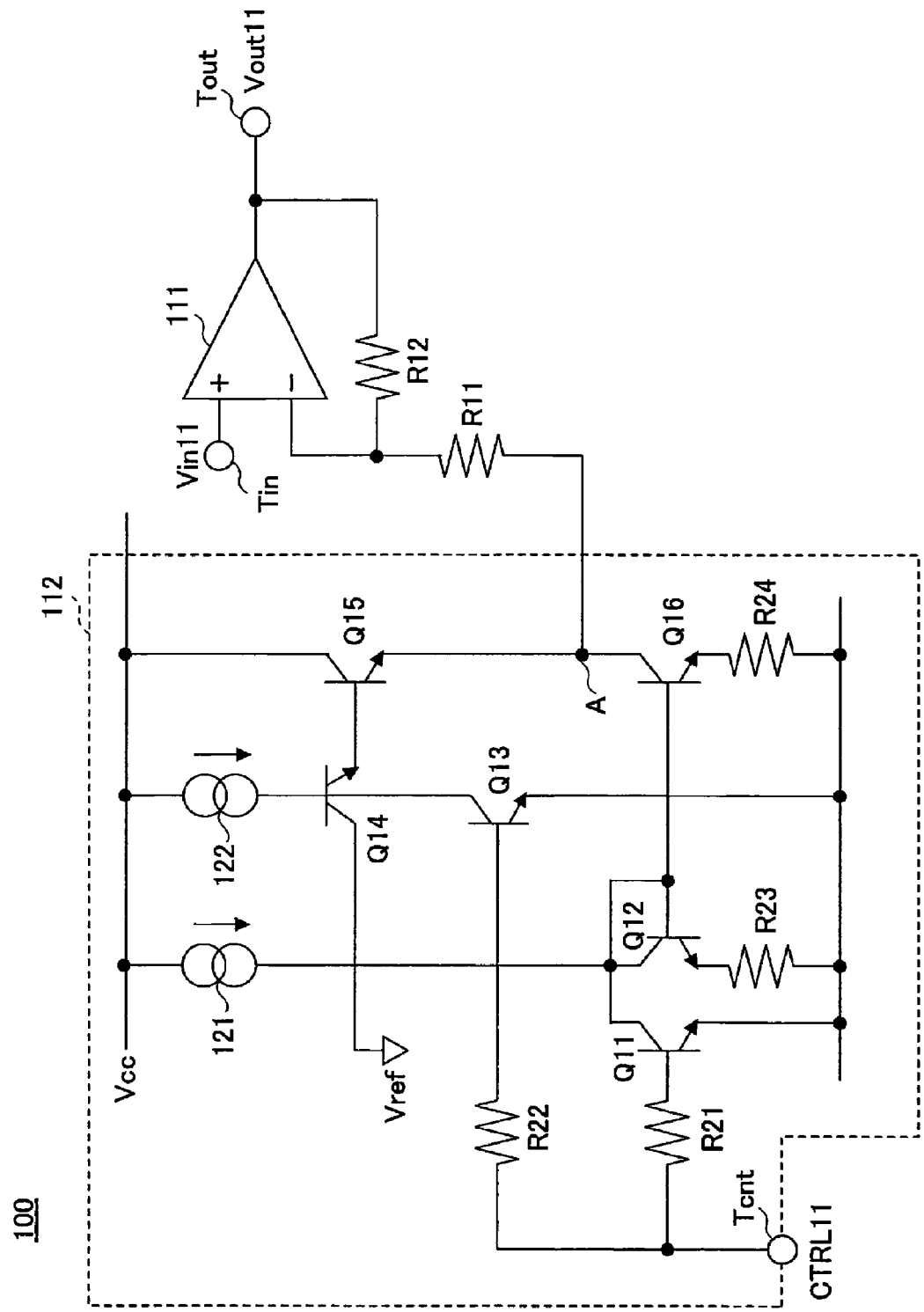
FIG. 1 is a circuit diagram of an amplifier circuit according to a first embodiment of the present invention.

FIG. 1 is a circuit diagram of an amplifier circuit 100 according to a first embodiment of the present invention.

The amplifier circuit 100 according to the first embodiment comprises a differential amplifier circuit 111, resistances R11 and R12, and a gain control circuit 112.

The differential amplifier circuit 111 has a non-inverting input terminal Tin, to which a voltage Vin11 is applied. An output terminal Tout and an inverting input terminal of the differential amplifier circuit 111 are connected through the resistance R12. The inverting input terminal of the differential amplifier circuit 111 is also connected to the gain control circuit 112 through the resistance R11. The differential amplifier circuit 111 amplifies the input voltage Vin11 and outputs an output voltage Vout11.

An end of the resistance R11 is connected to a connection point between the inverting input terminal of the differential amplifier circuit 111 and the resistance R12. An end of the resistance R12 is connected to a connection point between the inverting input terminal of the differential amplifier circuit 111 and the end of the resistance R11, while the other end of the resistance R12 is connected to the output terminal side of the differential amplifier circuit 111.

The gain control circuit 112 comprises constant current sources 121 and 122, the transistors Q11 through Q16, and resistances R21 through R24. The gain control circuit 112 has a gain control terminal Tcnt, from which a gain control signal CNTL11 is provided. The gain control signal CNTL11 from the gain control terminal Tcnt is provided to a base of the transistor Q11 through the resistance R21 and to a base of the transistor Q13 through the resistance R22.

The transistor Q11 is a NPN transistor, having a collector connected to the constant current source 121 and a grounded emitter. The transistor Q11 is turned ON when the gain control signal CNTL11 is low level, and is tuned OFF when the gain control signal CNTL11 is high level.

The transistors Q12 and Q16, each comprising a NPN transistor, form a current mirror circuit. The transistor Q12 has a collector connected to a connection point between the constant current source 121 and the collector of the transistor Q11 and to a base of the transistor Q16, and an emitter grounded through the resistance R23. The transistor Q16 has a base connected to a connection point of the constant current source 121, the collector of the transistor Q11, and the collector and base of the transistor Q12, a collector connected to the other end of the resistance R11, and an emitter grounded through the resistance R24.

The transistors Q12 and Q16 of the current mirror circuit are both turned ON when the transistor Q11 is turned OFF, and are both turned OFF when the transistor Q11 is turned ON.

The transistor Q13 is a NPN transistor, having a base connected to the gain control terminal Tcnt through the resistance R22, a collector connected to the constant current source 122 and a base of the transistor Q14, and a grounded emitter. The transistor Q13 is turned ON to lower the base voltage of the transistor Q14, when the gain control signal CNTL11 provided to the gain control terminal Tcnt is high level. The transistor Q13 is turned OFF to increase the base voltage of the transistor Q14, when the gain control signal CNTL11 is low level.

The transistor Q14 is a NPN transistor, having a base connected to a connection point between the constant current source 122 and the collector of the transistor Q13, an emitter connected to a base of the transistor Q15, and a collector to which a reference voltage Vref is applied. When the transistor Q14 is ON, the base voltage of the transistor Q15 is set to the reference voltage Vref.

The transistor Q15 is a NPN transistor, having a base connected to the emitter of the transistor Q14, a collector to which a supply voltage Vcc is applied, and an emitter connected to a connection point A between the other end of the resistance R11 and the collector of the transistor Q16. The transistor Q15 is turned ON to apply the reference voltage Vref with a base-emitter voltage Vbe of the transistor Q15 taken therefrom to the other end of the resistance R11, when the transistor Q14 is turned ON. The transistor Q15 is turned OFF to keep the other end of the resistance R11 in an open state, when the transistor Q14 is turned OFF.

[Operations]

When the input signal CTRL11 is high level, the transistors Q11 and Q13 are turned ON. As the transistor Q11 is turned ON, the transistors Q12 and Q16 are turned OFF. Also, as the transistor Q13 is turned ON, the transistor Q15 is turned OFF.

As the transistors Q15 and the Q16 are tuned OFF, the impedance of the connection point A to which the other end of the resistance R11 is connected becomes high. As the impedance of the connection point A becomes high, the amplifier circuit 100 is made to have only the resistance R12 connected to the differential amplifier circuit 111. In this state, the voltage gain Gv of the amplifier circuit 100 is as follows.

Gv=0

On the other hand, when the input signal CTRL11 is low level, the transistors Q11 and Q13 are turned OFF. As the transistor Q11 is turned OFF, the transistors Q12 and Q16 are turned ON. Also, as the transistor Q13 is turned OFF, the transistor Q15 is turned ON. Accordingly, the reference voltage Vref with the base-emitter voltage Vbe of the transistor Q15 taken therefrom is applied to the connection point A through the transistors Q14 and Q15. The other end of the resistance R11 is therefore set to the reference voltage Vref with the base-emitter voltage Vbe of the transistor Q15 taken therefrom.

As the other end of the resistance R11 is set to the reference voltage Vref with the base-emitter voltage Vbe of the transistor Q15 taken therefrom, the amplifier circuit 100 is made to have both of the resistances R11 and R12 connected to the differential amplifier circuit 111. In this state, the voltage gain Gv of the amplifier circuit 100 is as follows.

$$Gv=20\ \log((R11+R12/R11))$$

In this way, the gain control circuit 112 switches the state of the other end of the resistance R11 between the open state and the state where the reference voltage Vref with the base-emitter voltage Vbe of the transistor Q15 is applied, and thus connects or disconnects a resistance to the connection point between the inverting input terminal of the differential amplifier circuit 111 and the resistance R12. This allows the amplifier circuit 100 to change its gain.

[Advantages and Effects]

According to this embodiment, the differential amplifier circuit 111 is switched between the state where only the resistance R12 is connected thereto and the state where both of the resistances R11 and R12 are connected thereto in accordance with the gain control signal CNTL11, so that the voltage gain Gv of the amplifier circuit, which comprises the differential amplifier circuit 111 and the resistances R11 and R12, is switched between two levels, i.e., 0 and {20 log ((R11+R12)/R11)}. As such, having one differential amplifier circuit 111 allows the gain control, so that the voltage gain Gv is changed with such a simple configuration. The amplifier circuit can therefore have a reduced chip area, if applied to an IC.

Also, only the differential amplifier circuit 111 needs to be driven for either level of the gain, thereby minimizing the power consumption.

Second Embodiment

Figure 2:
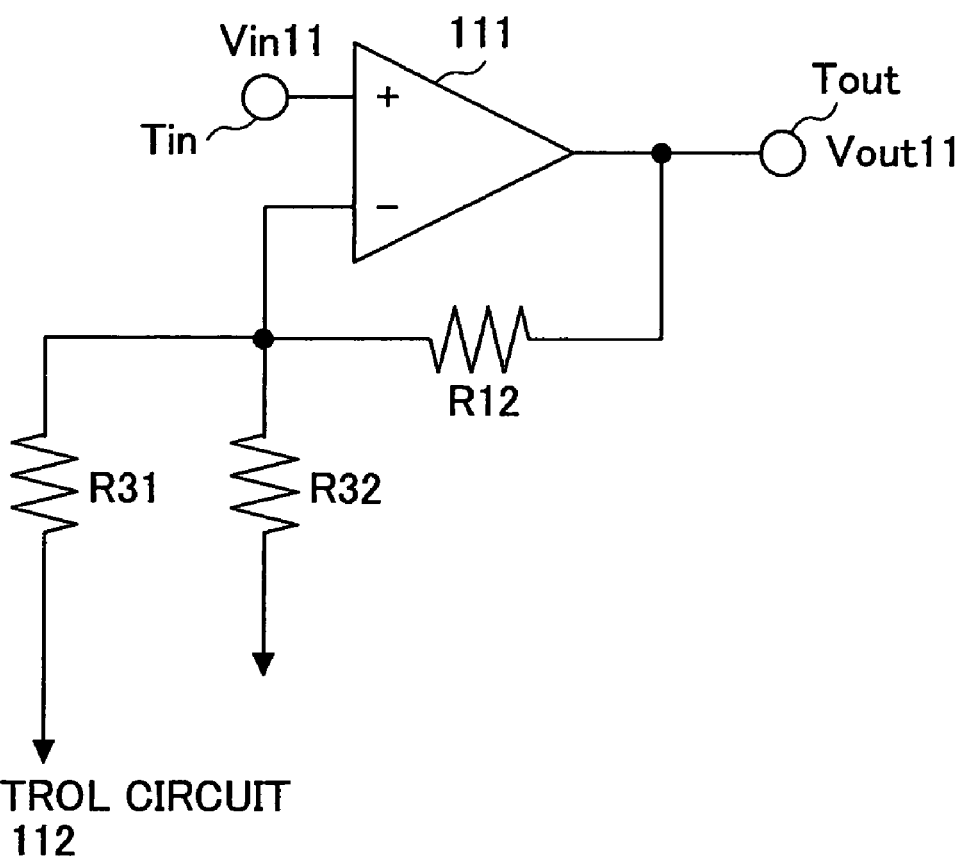
FIG. 2 is a circuit diagram of an amplifier circuit according to a second embodiment of the present invention.

FIG. 2 is a circuit diagram of an amplifier circuit 200 according to a second embodiment of the present invention. In FIG. 2, elements identical to those in FIG. 1 are denoted by the same reference numbers.

In the amplifier circuit 200 according to the second embodiment, a parallel circuit formed by resistances R31 and R32 is provided in place of the resistance R11. An end of the resistance R31 is connected to the gain control circuit 112. The gain control circuit 112 switches the state of the other end of the resistance R31 between the open state and the state where the reference voltage Vref is applied thereto.

When the gain control circuit 112 sets the resistance R31 to the open state, only the resistance R32 is connected to a connection point between the inverting input terminal of the differential amplifier circuit 111 and the resistance R12. When the gain control circuit 112 sets the other end of the resistance R31 to the state where the reference voltage Vref is applied, the parallel circuit formed by the resistances R31 and R32 is connected to the connection point between the inverting input terminal of the differential amplifier circuit 111 and the resistance R12.

In this way, the gain control circuit 112 switches the state of the other end of the resistance R31 between the open state and the state where the reference voltage Vref is applied, and thus changes the resistance of the connection point between the inverting input terminal of the differential amplifier circuit 111 and the resistance R12. This allows the amplifier circuit 200 to change its gain.

Third Embodiment

Figure 3:
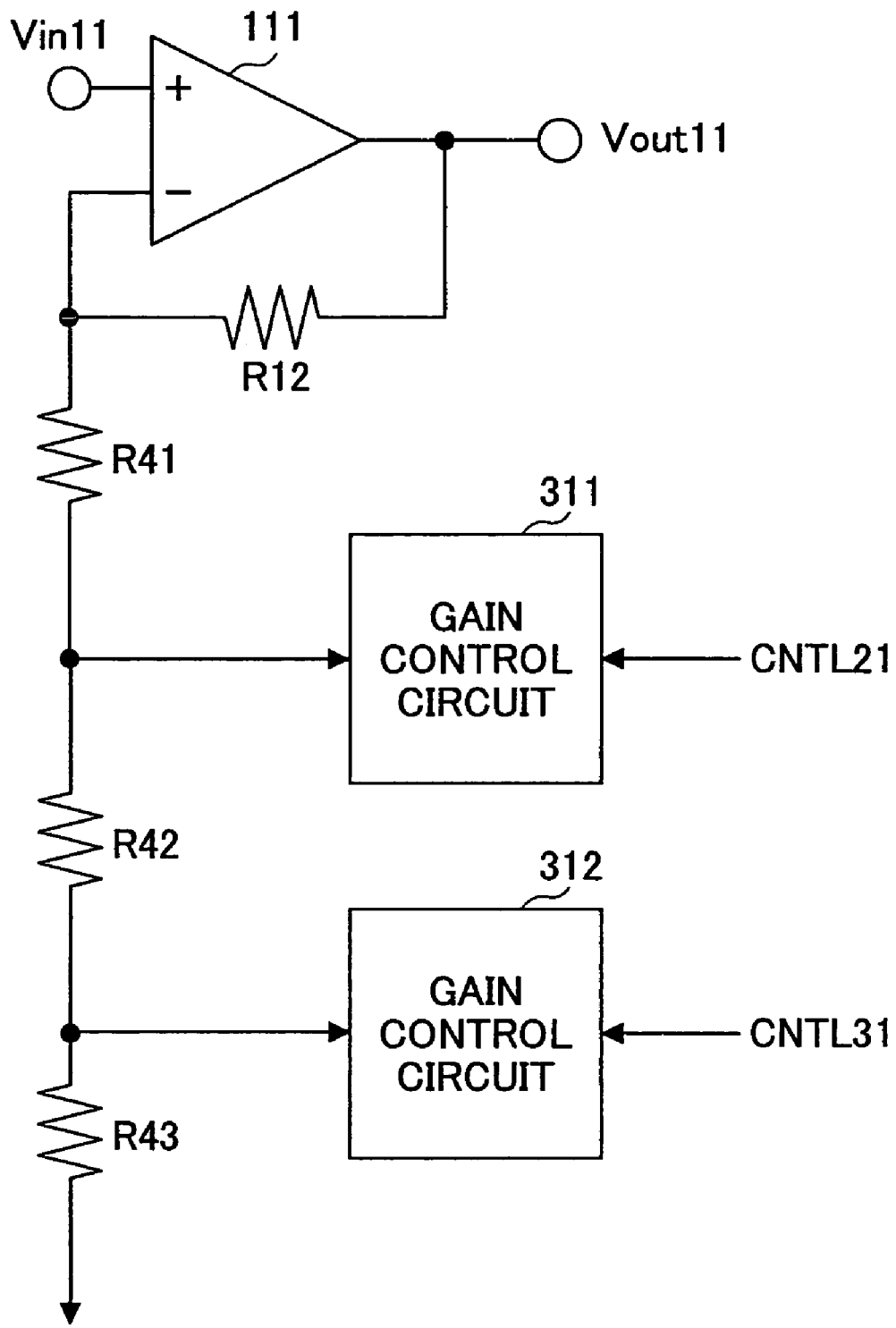
FIG. 3 is a circuit diagram of an amplifier circuit according to a third embodiment of the present invention.
Figure 4:
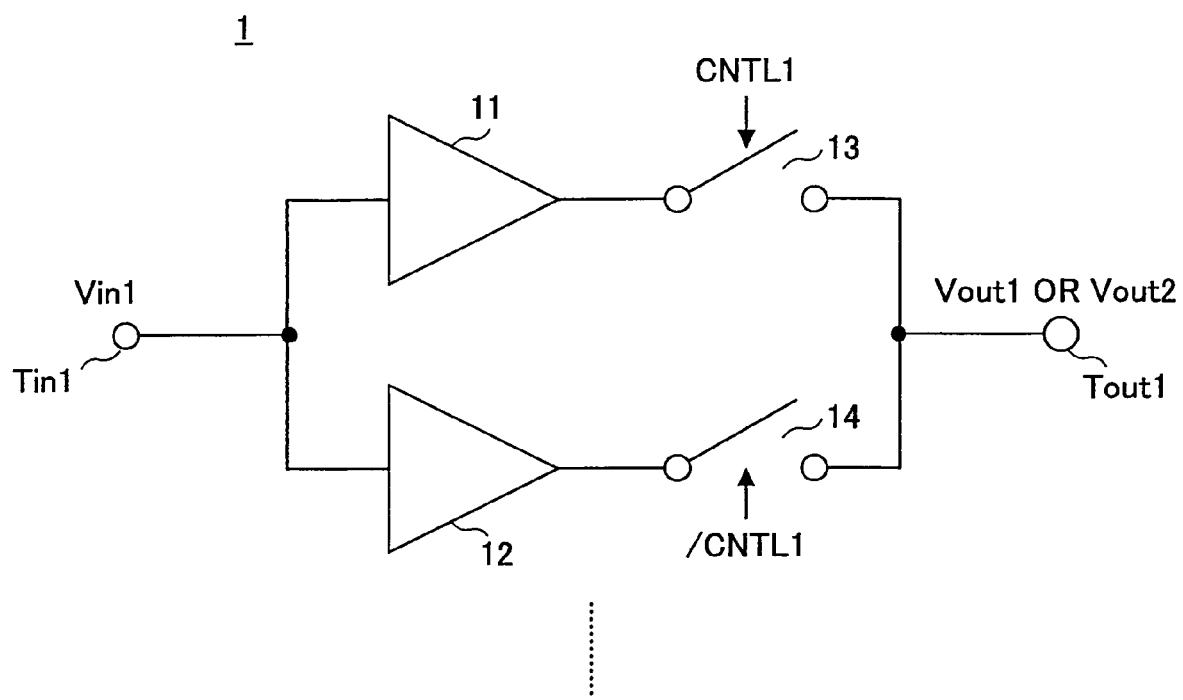
FIG. 4 is a circuit diagram of a related-art input circuit.
Figure 5:
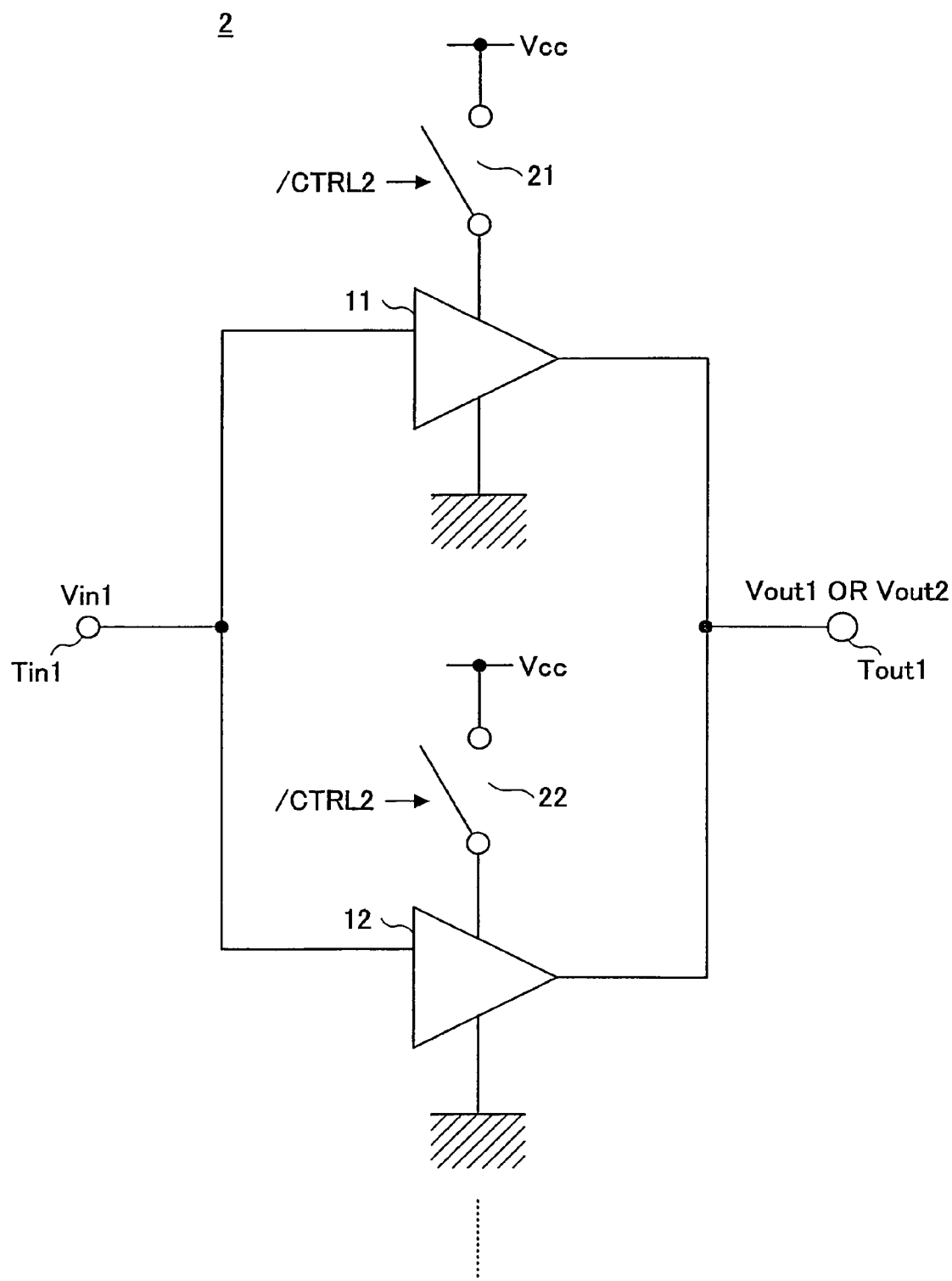
FIG. 5 is a circuit diagram of another related-art input circuit.

FIG. 3 is a circuit diagram of an amplifier circuit 300 according to a third embodiment of the present invention. In FIG. 3, elements identical to those in FIG. 1 are denoted by the same reference numbers.

In the amplifier circuit 300 according to the third embodiment, a series circuit formed by resistances R41, R42 and R43 is provided in place of the resistance R11. An end of the resistance R42 is connected to a first gain control circuit 311, and an end of the resistance R43 is connected to a second gain control circuit 312.

The first gain control circuit 311 sets the end of the resistance R42 to a short-circuited state or the open state according to a gain control signal CNTL21. The second gain control circuit 312 sets the end of the resistance R43 to the short-circuited state or the open state according to a gain control signal CNTL31.

When the first gain control circuit 311 sets the end of the resistance R42 to the short-circuited state, only the resistance R41 is connected to a connection point between the inverting input terminal of the differential amplifier circuit 111 and the resistance R12. When the first gain control circuit 311 sets the end of resistance R42 to the open state, and the second gain control circuit 312 sets the end of the resistance R43 to the short-circuited state, the resistances R41 and R42 are connected to the connection point between the inverting input terminal of the differential amplifier circuit 111 and the resistance R12.

When the first gain control circuit 311 sets the end of resistance R42 to the open state, and the second gain control circuit 312 sets the end of resistance R43 to the open state, the series circuit formed by the resistances R41 through R43 is connected to the connection point between the inverting input terminal of the differential amplifier circuit 111 and the resistance R12.

In this way, the first gain control circuit 311 and the second gain control circuit 312 connect or open the ends of the resistances R42 and R43, and thus change the resistances connected to the connection point between the inverting input terminal of the differential amplifier circuit 111 and the resistance R12. This allows the amplifier circuit 300 to change its gain.

The present application is based on Japanese Priority Application No. 2004-284856 filed on Sep. 29, 2004, with the Japanese Patent Office, the entire contents of which are hereby incorporated by reference.

What is claimed is:

1. An amplifier circuit capable of changing a gain to amplify an input signal according to a control signal, comprising:

a differential amplifier circuit adapted to receive and amplify the input signal to output the amplified input signal as an output signal;

a first resistance and one or more second resistances adapted to set the gain, wherein a first end of the one or more second resistances is connected to the differential amplifier circuit; and one or more gain control circuits connected to a second end of the one or more second resistances, each gain control circuit receiving a control signal and a reference voltage, each gain control circuit comprising:

a first transistor configured to receive the reference voltage and to output a reference voltage to the second end of the second resistances;

a second transistor configured to be controlled on or off by the control signal and connected between the second end of the second resistances and one end of a third resistance having another end connected to a ground, wherein, when the second transistor is turned off, the first transistor supplies the reference voltage to the second end of the second resistances, wherein, when the second transistor is turned on, the first transistor connects the reference voltage to the ground via the third resistance such that a predetermined voltage that is determined based on the reference voltage and the third resistance is provided to the second end of the second resistances such that the gain is controllable based on the voltage level of the reference voltage.

2. The amplifier circuit as claimed in claim 1, wherein the gain control circuit is adapted to switch the state of the second end of the second resistance between an open state and a state where the reference voltage is applied thereto.

3. The amplifier circuit as claimed in claim 1, wherein the second resistances are plural resistances connected in series or in parallel, and the one or more gain control circuits are adapted to short-circuit or open an end of each of the plural second resistances.

4. An input circuit capable of amplifying and outputting an input signal at a gain suitable for a device connected thereto according to a control signal, comprising:

a differential amplifier circuit adapted to receive and amplify the input signal to output the amplified input signal as an output signal;

a first resistance and one or more second resistances adapted to set the gain, wherein a first end of the one or more second resistances is connected to the differential amplifier circuit; and one or more gain control circuits connected to the second end of the one or more second resistances, each gain control circuit receiving a control signal and a reference voltage, each gain control circuit comprising:

a first transistor configured to receive the reference voltage and to output a reference voltage to the second end of the second resistances;

a second transistor configured to be controlled on or off by the control signal and connected between the second end of the second resistances and one end of a third resistance having another end connected to a ground, wherein, when the second transistor is turned off, the first transistor supplies the reference voltage to the second end of the second resistances, wherein, when the second transistor is turned on, the first transistor connects the reference voltage to the ground via the third resistance such that a predetermined voltage that is determined based on the reference voltage and the third resistance is provided to the second end of the second resistances such that the gain is controllable based on the voltage level of the reference voltage.

5. The input circuit as claimed in claim 4, wherein the gain control circuit is adapted to switch the state of the second end of the second resistance between an open state and a state where the reference voltage is applied thereto.

6. The input circuit as claimed in claim 4, wherein the second resistances are plural resistances connected in series or in parallel, and the one or more gain control circuits are adapted to short-circuit or open an end of each of the plural second resistances.

7. The input circuit as claimed in claim 1, wherein, when the control signal reaches a second predetermined level, the gain is set by the first resistance and one or more second resistances connected to the differential amplifier circuit.

8. The input circuit as claimed in claim 4, wherein, when the control signal reaches a second predetermined level, the gain is set by the first resistance and one or more second resistances connected to the differential amplifier circuit.

* * * * *